United States Patent
Takagi et al.

Patent Number: 5,914,924
Date of Patent: Jun. 22, 1999

[54] REPRODUCING OR RECORDING DEVICE FOR REPRODUCING, OR RECORDING ON, AN OPTICAL RECORDING MEDIUM

[75] Inventors: Hirohito Takagi, Chiba, Japan; Dietmar Peter, Wellendingen; Juergen Baeumle, Kuessaberg, both of Germany

[73] Assignee: Deutsche Thomson-Brandt GmbH, Villingen-Schwenningen

[21] Appl. No.: 08/926,702

[22] Filed: Sep. 10, 1997

[30] Foreign Application Priority Data

Sep. 25, 1996 [DE] Germany .............................. 196 39 215
Sep. 25, 1996 [DE] Germany .............................. 196 39 216

[51] Int. Cl.$^6$ ...................................................... G11B 7/00
[52] U.S. Cl. .................................... 369/44.35; 369/44.27; 369/47; 369/50
[58] Field of Search ........................ 369/44.35, 44.34, 369/44.27, 44.28, 44.29, 44.36, 44.25, 54, 58, 47, 48, 49, 50, 59, 32, 124

[56] References Cited

U.S. PATENT DOCUMENTS 5,224,086  6/1993  Wachi .
5,553,043  9/1996  Yamaguchi et al. .
5,623,465  4/1997  Sasaki et al. .................... 369/44.34 X

FOREIGN PATENT DOCUMENTS

0644659 A2  3/1995  European Pat. Off. .
3731643 A1  3/1989  Germany .
4115009 A1  11/1992  Germany .
4442899 A1  6/1996  Germany .

*Primary Examiner*—Muhammad N. Edun
*Attorney, Agent, or Firm*—Joseph S. Tripoli; Eric P. Herrmann; Ronald H. Kurdyla

[57] ABSTRACT

A reproducing and/or recording device for reproducing, or for recording on, an optical recording medium, having a tracking sychronization circuit (1), which has a variable center frequency generator (12, 13). The tracking synchronization circuit (1) can be operated with different center frequencies depending on application, and this has the advantage that identically designed tracking synchronization circuits (1) can be used for different purposes. It is advantageous that adaptive adjustment of a center frequency once prescribed is additionally possible during operation, thus increasing the capture range of the tracking synchronization circuit.

16 Claims, 5 Drawing Sheets

REPRODUCING OR RECORDING DEVICE FOR REPRODUCING, OR RECORDING ON, AN OPTICAL RECORDING MEDIUM

BACKGROUND OF THE INVENTION

1. Field of the Invention

The invention relates to a reproducing or recording device for reproducing, or recording on, an optical recording medium. Furthermore, the invention relates to a corresponding device having a circuit arrangement for a phase-locked loop, also termed a tracking synchronization circuit, having a phase detector for comparing a reference signal with a tracking signal, and for supplying an output value corresponding to the phase shift between the reference and tracking signals, and having a controller, which is connected to the output of the phase detector and leads to the input of a tracking oscillator.

2. Description of the Prior Art

So-called phase-locked loop or PLL circuits for tracking synchronization are known in control engineering. The aim of such circuits is to set the frequency of an oscillator such that it corresponds to the frequency and phase of a reference oscillator. The frequency of the tracking oscillator can be varied with the aid of a control voltage. So-called voltage-controlled oscillators (VCO) are used as oscillators. Analog computer oscillators or function generators can be used for low frequencies. Suitable for use at higher frequencies are emitter-coupled multivibrators or else any LC oscillator by connecting a variable capacitance diode in parallel with the resonant circuit. The phase detector used supplies an output voltage which is determined by the phase shift between the tracking AC voltage and the reference AC voltage.

It is true that digital phase detectors are used in the case of known devices with digital phase-locked loops, but recourse is made to analog VCOs for the tracking oscillator. Such circuit arrangements suffice for applications with a defined hold range. However, there are problems when signals of different frequency reach the phase-locked loop. In such cases, the data rate or the frequency of the input signals can lie outside the hold range, as a result of which the phase-locked loop ceases to be locked and reliable operation is no longer ensured. In such cases, the centre frequency of the analog VCO must be reset, and this leads to increased outlay on circuitry.

Known devices with a digital phase-locked loop can therefore certainly be expanded with regard to the frequency range which can be processed, by being switching over but the control precision is reduced since the aim will be to prescribe the hold range to be as wide as possible in order to minimize the outlay for switching over.

It is therefore the object of the invention to specify a reproducing or recording device for reproducing, or recording on, an optical recording medium having a circuit arrangement for a phase-locked loop, which has a high control precision and is capable of processing a wide input frequency range without the need for the discrete resetting of the centre frequency as a function of the input frequency.

This object of the invention is achieved by means of a device in accordance with the features of the independent patent claims, advantageous and expedient embodiments and developments of the invention being specified in the subclaims.

BRIEF SUMMARY OF THE INVENTION

In accordance with a first basic idea of the invention, the tracking synchronization circuit of the device according to the invention has a variable centre-frequency generator which generates an oscillation with a variable centre frequency. This has the advantage that discrete resetting of the centre frequency is superfluous. A further advantage is to be seen in that the centre frequency is not rigidly fixed but can be adapted to changing operating conditions. The tracking synchronization circuit can be operated with different centre frequencies, depending on application, and this has the advantage that identically designed tracking synchronization circuits can be used for different purposes. Adaptive adjustment of a centre frequency once prescribed is additionally advantageously possible during operation, resulting in an increase in the capture range of the tracking synchronization circuit. This has the advantage that a reference frequency which exhibits a relatively large drift in frequency with time can nevertheless be tracked with a relatively small bandwidth. In the case of the device according to the invention, the output of the scanner can be connected to the tracking synchronization circuit both directly and with the interposition of one or more components for preprocessing or conditioning the signals emitted by the scanner.

The tracking synchronization circuit is designed according to the invention as a digital circuit. This has the advantage that it can be constructed particularly simply as a digital circuit and be used particularly flexibly. The possibility of integration in a semiconductor chip is particularly easy in this case.

According to the invention, the tracking synchronization circuit contains a digital filter of second order. This has the advantage that its parameters can be set without a high outlay such that a tracking signal of the desired frequency is produced and, at the same time, it is possible for the variable centre frequency to be tracked adaptively.

The tracking synchronization circuit advantageously contains at least one multiplier with a variable multiplication factor as a variable filter coefficient. This has the advantage that the centre frequency can be set variably by varying this factor. This can be a centre frequency which has once been prescribed, on the one hand, but it is also possible for it to be a frequency which can be adapted during operation.

According to the invention, the tracking synchronization circuit has an evaluation circuit which determines at least one variable multiplication factor from a phase difference signal. This has the advantage that drifting of the frequency of the reference signal can be compensated without a high outlay.

In accordance with a basic idea of the invention, the tracking oscillator used in the digital phase-locked loop comprises a digital filter of second order with at least one variable programmable filter coefficient, it being possible for the centre frequency to be adapted by prescribing an updated filter value in the case of variation in the frequency of the reference signal, that is to say the input frequency, beyond the instantaneous, very narrowly selectable hold range of the filter.

Thus, by means of adaptive setting of the centre frequency of the tracking oscillator it is possible to move an inherently narrowly selectable hold range over a corresponding frequency spectrum, as a result of which changes in the input frequency do not have a disadvantageous effect on the control precision of the phase-locked loop. According to the invention, it is possible by recourse to a digital filter of second order to dispense with otherwise necessary analog voltage-controlled oscillators, thus rendering single-chip solutions in purely digital form capable of implementation. Because of the digital filter structure with programmable coefficients, there is a high flexibility in the phase-locked loop, with the result that a multiplicity of new fields of application can be opened up.

According to the invention, the adaptation of the filter characteristics by means of prescribing updated filter coefficients renders it possible to reset the respective centre frequency of the phase-locked loop in order overall to achieve over a wide frequency spectrum a capture range of the control loop which is large in total, it being possible for the instantaneous hold range to be very narrow given a set filter coefficient, thus reducing a jitter effect which can occur, that is to say continuous jumping between two different frequencies.

In accordance with a further basic idea of the invention, the tracking oscillator constructed as a digital filter comprises a trigger module and a digital oscillator module, the trigger module serving for the purpose of definite triggering of the digital oscillator module.

The tracking oscillator is constructed such that a virtually sinusoidal output oscillation is generated, the trigger module being used via, for example, 8-bit coefficients and with the aid of a resettable input register to prescribe the amplitude for the actual oscillator.

In one embodiment of the tracking oscillator, a limiter is provided on the output side for adjusting the oscillator amplitude to the input sensitivity of the digital phase detector.

According to a supplementary basic idea of the invention, an evaluation circuit, a so-called sequencer, is used as controller for driving the tracking oscillator, that is to say for providing filter coefficients for the digital filter of second order, it being possible to change the frequency of the digital filter in correspondingly small steps in the case of a prescribable small output value of the phase shift and, in the case of a changed frequency of the reference or input signal, respectively, new, updated filter coefficients of larger step width are output by detecting the overshooting of a prescribable relatively large output value of the phase shift, for the purpose of setting the adapted centre frequency of the tracking oscillator.

According to the invention, the digital filter of second order for forming the tracking oscillator in the phase-locked loop is a filter with stable limits, that is to say it has two complex poles on the unit circle, in order to be able to start oscillating reliably after the corresponding pulse from the trigger module.

The initialization value of the filter coefficients C1 and C2 is obtained according to the invention from the following relationship:

$$C1=C2=\cos(2\pi F/Sf),$$

F corresponding to the desired oscillator frequency, and Sf representing the sample frequency or pulse frequency of the digital filter, which is to be selected to be higher by a multiple than the maximum input frequency.

According to the invention, it is further proposed to provide the digital phase-locked loop with a digital low-pass filter which is connected to the output of a digital phase detector, and which is connected on the output side to the input of the controller.

The digital phase-locked loop constructed in such a way is capable, for example, of electronically damping so-called howling frequencies which can arise owing to mechanical vibrations in the case of optical scanning devices. For this purpose, a control signal is led from a servo controller of a drive circuit of a scanning device, for example for a CD player, to the digital phase-locked loop, which supplies a signal on the output side which serves to influence the track control and the focus correction of the optical scanning system. In this way, low-frequency superimpositions of the optical scanning system, which are produced by mechanical resonances and have a natural frequency in a range of from 600 to 1000 Hz, can be effectively suppressed without needing to have recourse to complex mechanical damping elements or compensation elements.

All in all, the invention renders it possible to specify a reproducing or recording device having a circuit arrangement for a completely digital phase-locked loop with the aid of which, given the use of a digital filter of second order as tracking oscillator, it is possible both to increase the control precision and to use it for different frequencies of the incoming signals.

The centre frequency of the digital oscillator can be prescribed in a desired width range by adaptively prescribing filter coefficients, without the need to switch over manually or electronically to oscillators of different centre frequencies. Owing to the fact that a narrowly selectable hold range comes along, as it were, with a changed centre frequency, it is ensured that the phase-locked loop does not become unlocked with regard to variations in the reference signal. The result is an improvement in the operational performance.

Because of its completely digital conception, the digital phase-locked loop according to the invention can be a constituent of a one-chip solution, thus rendering it possible to lower the outlay on producing drive circuits, for example to operate optical scanning devices for a CD player or the like.

Furthermore, the invention also relates to a device having a circuit for suppressing the howling noise of an adjustable, servo-controlled sampling system of the device, the circuit having an interference signal suppression unit which, from the servo-control signal, detects the interference signal causing the howling, generates an inverse interference signal with the same amplitude but the opposite phase to the interference signal, and adds this inverse interference signal to the servo-control signal. The circuit according to the invention preferably has a tracking synchronization circuit, also called a phase-locked loop or PLL, for the purpose of phase detection and generating inverse interference signals, a digital tracking synchronization circuit generally being used. Furthermore, the tracking synchronization circuit has a phase detector, a low-pass filter and a discrete clock oscillator. The circuit of the device according to the invention also has an amplitude detector. The amplitude detector preferably has a bandpass filter, a gain detector and a low-pass filter. The circuit preferably has a further amplifier, which uses the output signal of the tracking synchronization circuit as input signal, and the output signal of the amplitude detector as control signal.

Furthermore, the circuit of the device according to the invention has a switch for applying the inverse interference signal to the servo signal, the switch being controllable.

All the components of the circuit of the device can advantageously be formed by means of digital filters, with the result that the circuit is entirely flexible and can be adjusted to the optical disc player by programming the digital filters appropriately.

The present invention further relates to a device of the generic type, a circuit for suppressing the howling noise being connected between the servo controller and the actuator of the adjustable sampling system of the device, which system is designed as an optical scanner.

The device is preferably a CD player, a digital video disc player such as a DVD player, a minidisc player, a CD ROM drive or an appropriate recording device.

The present invention also relates to a method for suppressing howling noises of a servo-controlled sampling system in a device of the generic type, in particular an optical disc player, having the following steps:

a) detecting the interference signal causing the howling in the servo-control signal, b) generating an inverse interference signal having the same amplitude but the opposite phase to the interference signal, and c) adding the inverse interference signal to the servo-control signal. It is preferable in step a) to determine the phase and the amplitude of the interference signal. The method according to the invention is preferably carried out as a digital method.

The principle of this aspect of the invention, specifically to generate an oscillation, in particular a sinusoidal wave, which corresponds to the interference signal except for the phase, that is to say which has a phase opposite to the interference signal phase, and to superimpose this on the servo signal, so that the interference signal is removed, has the following advantages: the costs are reduced, since there is no need for mechanical improvement of the mounting plate. Using the method or device according to the invention, extinguishing the interference signal is completely independent of the mechanical characteristics of the device. There is a high reliability, owing to the dynamics of the digital suppressor, given the use of a tracking synchronization circuit. The extinction of the interference signal does not influence the behaviour of the optical scanning element, and there is therefore no feedback to the servo controller, with the result that the characteristic of the servo controller is not adversely affected. Furthermore, the invention is highly flexible, since the circuit for digital suppression of such howling noises is based on digital filter structures with programmable coefficients. Reprogramming in accordance with the desired applications is therefore possible, with the result that the digital howling suppressor does not have to be tuned in terms of hardware to the specific device.

It goes without saying that the individual specified features and embodiments of the invention are also advantageously used in combination with one another, and that the present invention is not limited to the specified exemplary embodiments.

BRIEF DESCRIPTION OF THE DRAWINGS

The invention is to be explained in more detail below with the aid of exemplary embodiments and of figures, in which.

DETAILED DESCRIPTION OF THE PREFERRED EMBODIMENT

Figure 1:
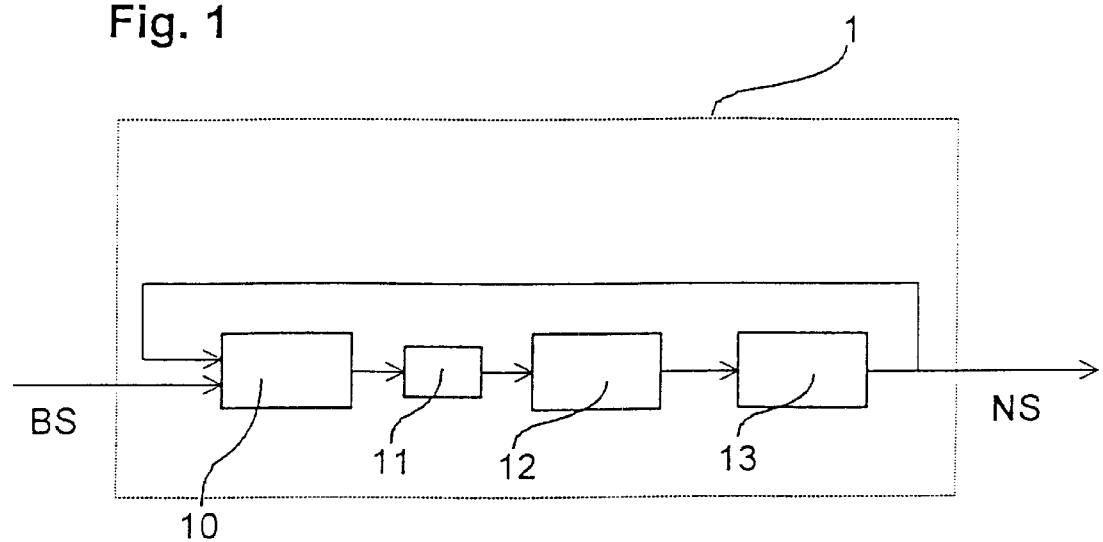
FIG. 1 shows a block diagram of an arrangement showing the principle of a digital phase-locked loop of a device according to the invention.

In the block diagram of a tracking synchronization circuit 1, or of a digital phase-locked loop, shown in FIG. 1 the reference or input signal BS is led to the first input of a phase detector 10, to whose second input the tracking signal NS is fed back. The result of comparison of the phase detector 10, the phase signal PS is led in the exemplary embodiment shown to a low-pass filter 11 which is provided, in particular, for the case of application of so-called howling compensation in mechano-optical scanning devices, which is described in more detail below with reference to FIG. 4. It is also possible to provide another element here in different applications.

The output of the low-pass filter 11, at which the filtered phase signal PS' is present, is connected to the input of an evaluation circuit 12, also denoted below as a sequencer, which serves to determine the filter coefficient(s) C1, C2, in each case as a function of the phase signal PS, PS' referred to a prescribed value P1. The filter coefficient(s) C1, C2 pass to the tracking oscillator 13, whose design is described in more detail with reference to FIG. 2. The PLL frequency or the tracking signal NS is obtained at the output of the tracking oscillator 13.

The circuit arrangement, described with the aid of FIG. 1, for a phase-locked loop corresponds in principle to an arrangement for synchronizing the frequency and phase of oscillations, which has a phase comparison circuit (phase detector 10), a controller and an oscillator.

Figure 3:
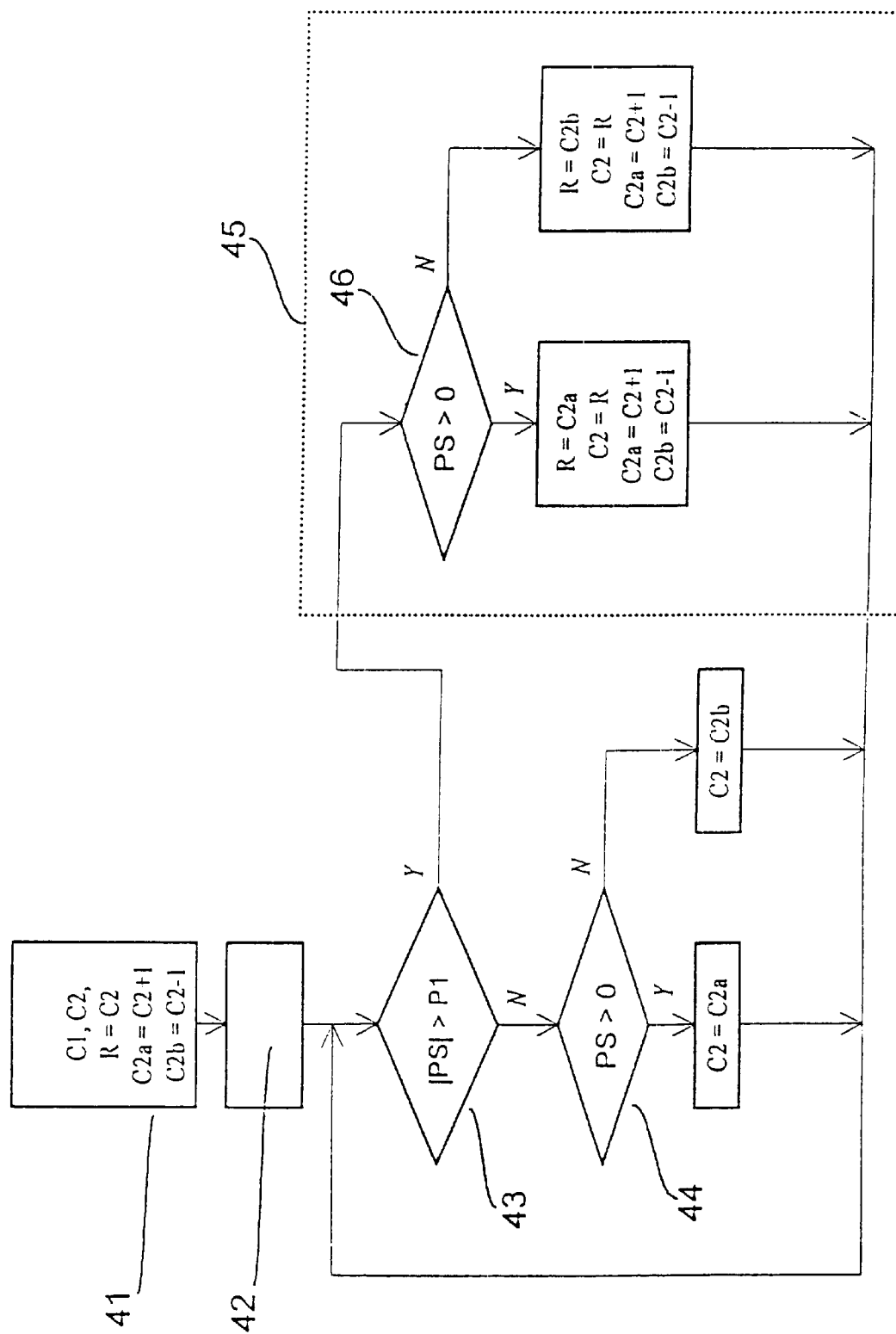
FIG. 3 shows a flowchart to explain the mode of operation of the evaluation circuit, with the aim of deriving the filter coefficients.

By contrast with digital phase-locked loops which have an analog voltage-controlled oscillator as oscillation-producing module, in the case of the present exemplary embodiment, however, recourse is made to a digital oscillator comprising a filter of second order, the respective filter coefficients being provided for adaptive adjustment of the centre frequency of the digital oscillator of the evaluation circuit 12, as is represented with the aid of the explanation of the flowchart according to FIG. 3.

Figure 2:
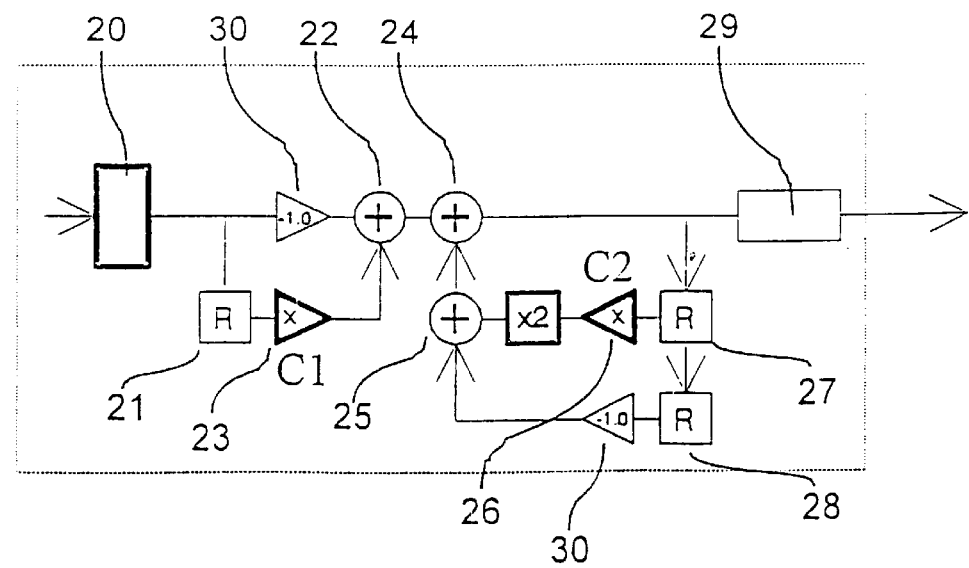
FIG. 2 shows a block diagram of the design of a digital filter for use as tracking oscillator.

The digital oscillator 13 in accordance with FIG. 2, which is represented by a digital filter 2, is excited to oscillate by a trigger pulse TP which can be applied from outside. Since this trigger pulse TP can in some circumstances last longer than a clock cycle, the oscillator 13 has a resettable input register 20 which initially stores the incoming trigger pulse TP, which can be an 8-bit value, for example. The magnitude of the trigger pulse TP influences the amplitude of the tracking signal NS produced thereafter. As soon as the input register 20 is read out in the next clock pulse, its value is reset to zero, independently of whether the trigger pulse TP is still present at its input. The value emitted by the input register 20 is fed to a first register 21. The value emitted with a delay by the register 21 is led, multiplied in a first error coefficient multiplier 23 by an initialization coefficient or multiplication factor C1, to a first adder 22 at whose second input the undelayed output value of the input register 20 is present, multiplied by the factor −1.

The output signal, obtained from the trigger circuit described above, of the first adder 22 triggers the oscillator module of the tracking oscillator 13 to oscillate, with the result that oscillations on the output side are obtained, each having an adapted centre frequency.

The digital oscillator module contains a second adder 24, a third adder 25, a second filter coefficient multiplier 26, as well as a second register 27 and a third register 28, the second and third registers 27, 28 acting as a delay circuit.

Via a limiter 29, the output signal yielded by the digital oscillator module can be subjected to amplitude damping, in order to undertake appropriate level adjustment to the input sensitivity of the phase detector (FIG. 1).

The second and third registers 27, 28 are firstly set by the output signals, caused by the trigger pulse TP, of the first adder 22. The first multiplier 23 has a coefficient value corresponding to the multiplication factor C1. This initialization coefficient corresponds initially in terms of value to a second coefficient, the multiplication factor C2 of the second multiplier 26. To start up or initialize the tracking oscillator, the multiplication factors C1 and C2 are determined according to the following relationship:

$$C1C2 = \cos(2\pi F/Sf) \text{ where}$$

F=desired frequency of the tracking oscillator, and Sf=sampling frequency of the tracking oscillator 13. The sampling or clock frequency Sf must be selected in this case to be higher by a multiple than the maximum input frequency, in order to ensure correct functioning.

To adapt the desired filter or centre frequency to changed input frequencies of the reference signal BS, only the multiplication factor C2 is then changed in the continuous operation of the oscillator module. This change is performed in accordance with the absolute phase error determined, which is available as a phase signal PS at the output of the phase detector 10. Consequently, the frequency of the digital tracking oscillator 13 is adjusted adaptively to changed reference signal frequencies by varying the filter coefficient C2.

The second adder 24 of the digital oscillator module is connected on the input side both to the output of the first adder 22 and to the output of the third adder 25. Present at the inputs of the third adder 25 are the output of the second filter coefficient multiplier 26, taking account of the filter coefficient C2, as well as, at a further input, a multiplier 30, whose multiplication factor is −1.

The registers 27 and 28 are delay-line registers, that is to say their transfer function is $Z^{-1}$. The second register 27 is connected to the input of the second multiplier 26, and the third register 28 is connected to the input of the multiplier 30.

The input of the second register 27 is present at the output of the second adder 24. The output signal is thus fed back via the second multiplier 26 and the third adder 25. The delay $Z^{-1}$ between the second and third registers 27 and 28 results from the fact that the output of the second register 27 is connected to the input of the third register 28. A desired sinusoidal characteristic of the output oscillation of the digital oscillator can be obtained by prescribing the delay values of the registers 27 and 28, that is to say their sampling frequency Sf, as a function of the trigger pulse, in particular of the amplitude thereof, from the resettable input register 20 and the coefficients C1 and C2.

The mode of operation of the evaluation circuit 12, also called a sequencer, in accordance with FIG. 1 is to be described below with the aid of an explanation of the flowchart for determining the filter coefficients with reference to FIG. 3.

Firstly, during an initialization step 41 the filter coefficients are fixed for the initialization. In the exemplary embodiment, these are the multiplication factors C1 and C2, with which the tracking oscillator 13 is started up. For this purpose, it is necessary with regard to the required sampling frequency Sf to take account of the sampling theorem in order to ensure that the sampling or clock frequency is adjusted to the maximum frequency to be processed.

The initialization centre frequency of the tracking oscillator 13 is determined by the filter coefficient C2. Upper and lower sequencer parameters C2a and C2b are fixed at the same time. These parameters C2a and C2b are shifted from the filter coefficient C2 by prescribed step widths, which assume the value 1 in the exemplary embodiment. During further operation, they serve the purpose of enabling the tracking oscillator frequency to be adjusted as a function of the input frequency or input signal sequence. Furthermore, an internal coefficient R is fixed in the initialization step 41.

After the phase-locked loop in accordance with the described exemplary embodiment has been set in operation by the step START 42, the absolute phase error is firstly checked in step 43 by comparing the phase signal PS with a prescribed sequencer parameter P1. If the absolute phase error, that is to say the absolute value of the phase signal PS, is smaller than or equal to the prescribed value P1, a sign check 44 is performed and, depending on the result of this sign check, a new filter coefficient C2=C2a or C2b is prescribed with a small step width. The choice as to whether the coefficient C2a or C2b is selected is performed as a function of the sign determined for the phase error. As long as the absolute phase error does not overshoot the value of the parameter P1, the multiplication factor C2 swings between the values C2a and C2b, that is to say the frequency of the tracking oscillator 13 changes only within narrow limits.

In the case when the absolute phase error overshoots the prescribed value of the parameter P1, the adaptive routine 45 for varying or adjusting the centre frequency of the digital oscillator is initiated, with the aim of appropriately shifting or changing the centre frequency so that the phase-locked loop remains in the locked state.

After an appropriate sign check 46 of the phase error with an absolute value greater than the prescribed value P1, new values are determined for the parameters and coefficients C2a, C2b, C2 and R. In the exemplary embodiment, these new values are R=C2+1 and C2=R, in the case of a positive phase error, and R=C2−1 and C2=R in the case of a negative phase error. Upper and lower sequencer parameters C2a and C2b are determined with the aid of the new value for C2 using the selected step width; this has the value 1 in the exemplary embodiment. The centre frequency then specified depends directly on the new coefficient for C2. In the case of a phase error less than or equal to the prescribed value P1, the new value for the stepwise variation in the filter coefficient C2 is set as C2a=C2+1 and C2b=C2−1. In addition to the updated centre frequency, new limiting values are thus determined for an updated hold range, as a result of which, on the one hand, the phase-locked loop is prevented from being unlocked in the case of an instantaneous increase in the phase error and, on the other hand, by contrast with known solutions the hold range can be kept small, thus making it possible to reduce disadvantageous jitter effects, that is to say jumping to and fro between two relatively different frequencies.

Figure 4:
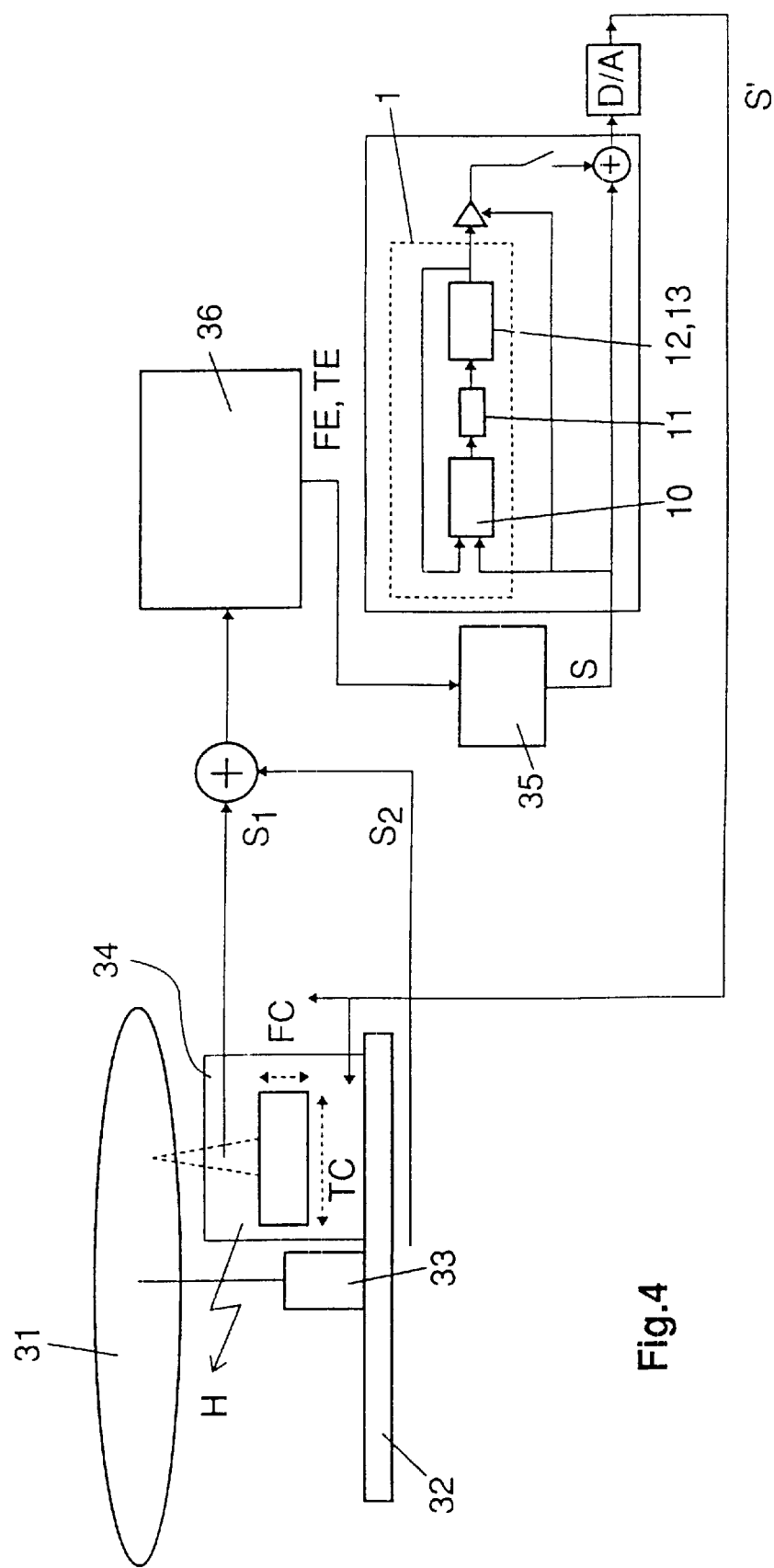
FIG. 4 shows a block diagram for explaining the use of a digital phase-locked loop to eliminate so-called howling noise in a device according to the invention.

A preferred exemplary embodiment of an application of the digital phase-locked loop for optical scanning devices is to be described with the aid of FIG. 4.

It is known that in the case of opto-mechanical scanning devices the interaction of mechanical elements for driving an optical recording medium, for example a compact disc, as well as for following the track and correcting focus errors in the sampling system 34 can produce resonant frequencies which lead to natural oscillations of the system which in the audible range, for example, are between 600 Hz to 1 kHz. In order to circumvent this problem, it has been proposed to arrange mechanical dampers, for example in the form of viscous materials, for decoupling the mechanical components, the aim thereby being to prevent natural oscillations. Such solutions are, however, of very complicated design and can be found for different scanning devices only within the scope of extensive experiments.

FIG. 4 shows an optical scanning device for an optical recording medium 31, a mechanical carrier 32 holding a drive motor 33 for producing a rotating movement of the recording medium 31. The optical scanning system 34 projects a laser beam correctly focused onto the surface of the recording medium 31 and receives the reflection signals, which pass to a detector arrangement (not described here in more detail).

For the purpose of tracking and focus control, the optical scanning system 34 has appropriate mechanical components such as, for example, a tracking coil TC and a focusing coil FC. Signals S1 are transmitted via the detector arrangement mentioned to an error signal former 36, and interference components S2, caused by the mechanical properties of the mechanical carrier 32, are superimposed on them. The error signal former 36 determines therefrom a focusing error signal FE and a tracking error signal TE, from which a servo-control signal S can be derived with the aid of a servo-control 35. This servo signal S now passes to the digital phase-locked loop with the above described tracking oscillator consisting of a digital filter of second order, the output frequency of the phase-locked loop referred to the phase opposite to the howling frequency having the same amplitude, however, with the result that it is possible to compensate the undesired oscillations in a purely electronic way. The compensated signal S' is then lead to the focusing coil FC and the tracking coil TC.

As represented in principle in FIG. 4, the use of a digital phase-locked loop having a tracking oscillator based on a digital filter of second order suppresses or compensates howling frequencies, the result being a servo signal for driving a tracking and focusing correction device, in particular a tracking or focusing coil, which is free from interference components which can cause an unpleasant howling noise H.

Figure 5:
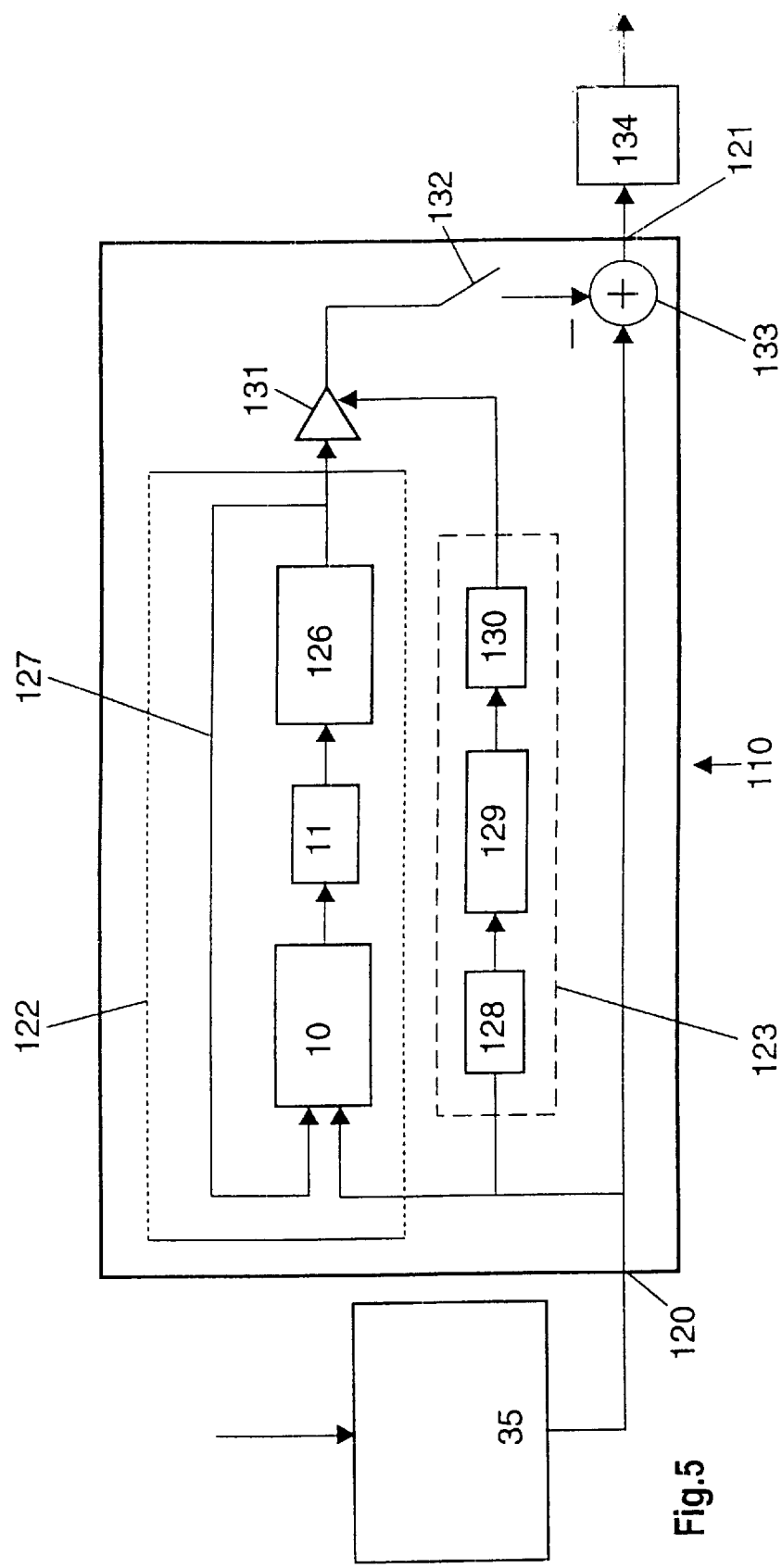
FIG. 5 shows a detailed representation of a phase-locked loop for eliminating howling noise in accordance with FIG. 4.

FIG. 5 shows the block diagram of the digital howling noise suppressor. The signals of the servo-signal controller 35 pass via an input 120 into the interference signal suppression unit 110, the signal path of the focusing and tracking control signals being looped through the interference signal suppression unit 110 to the output 121. Furthermore, the control signals pass into a tracking synchronization circuit 122, also called a phase-locked loop, and an amplitude detector 123, which is connected in parallel with the tracking synchronization circuit 122. The tracking synchronization circuit 122 serves to detect the phase of the interference signal and to produce a signal shifted in accordance with 180° relative to the interference signal. Consequently, the tracking synchronization circuit 122 has a phase detector 10, a low-pass filter 11 and a digital clock oscillator 126, as well as a feedback path 127. The parallel-connected amplitude detector 123 contains a bandpass filter 128, a gain detector 129 and a low-pass filter 130 in the said sequence. The output sinusoidal signal of the tracking synchronization circuit, which is shifted by 180° relative to the interference signal, is fed to an amplifier 131 in which the amplitude is adjusted in accordance with the interference signal by the amplitude detector 123, with the result that an inverse interference signal is generated. This comes about owing to the fact that the gain for the digital amplifier 131 is inverted, as a result of which the output signal of the tracking synchronization circuit 122 is shifted by 180° by comparison with the signal present at the input 120. The coefficients of the digital amplifier are advantageously provided in this case by a microprocessor in two's complement form. In this case, the output signal of the amplitude detector 123 is used as control signal for the amplifier 131. Furthermore, the interference signal suppression unit 110 also has a switch 132, which is generally controllable and can be used to add the inverse interference signal to the control signals by means of an adder 133. Since the additional signal added in the adder 133 corresponds in amplitude exactly to the sinusoidal interference signal, but with opposite phase, there is a complete extinction of the interference signal in the adder 133, with the result that the pure control signals, not affected by interference, of the digital servo control 35 are present at the output 121 of the interference signal suppression unit 110. These control signals are converted into analog form in a digital-to-analog converter 134 so that they can be used in the actuators of the optical scanning unit. The bandpass filter 128 and low-pass filter 130 ensure that an inverse signal is generated only for those frequency ranges and is added to the actual signal in which the interference noise is also present, that is to say in the range of approximately 600–1000 Hz.

Figure 6:
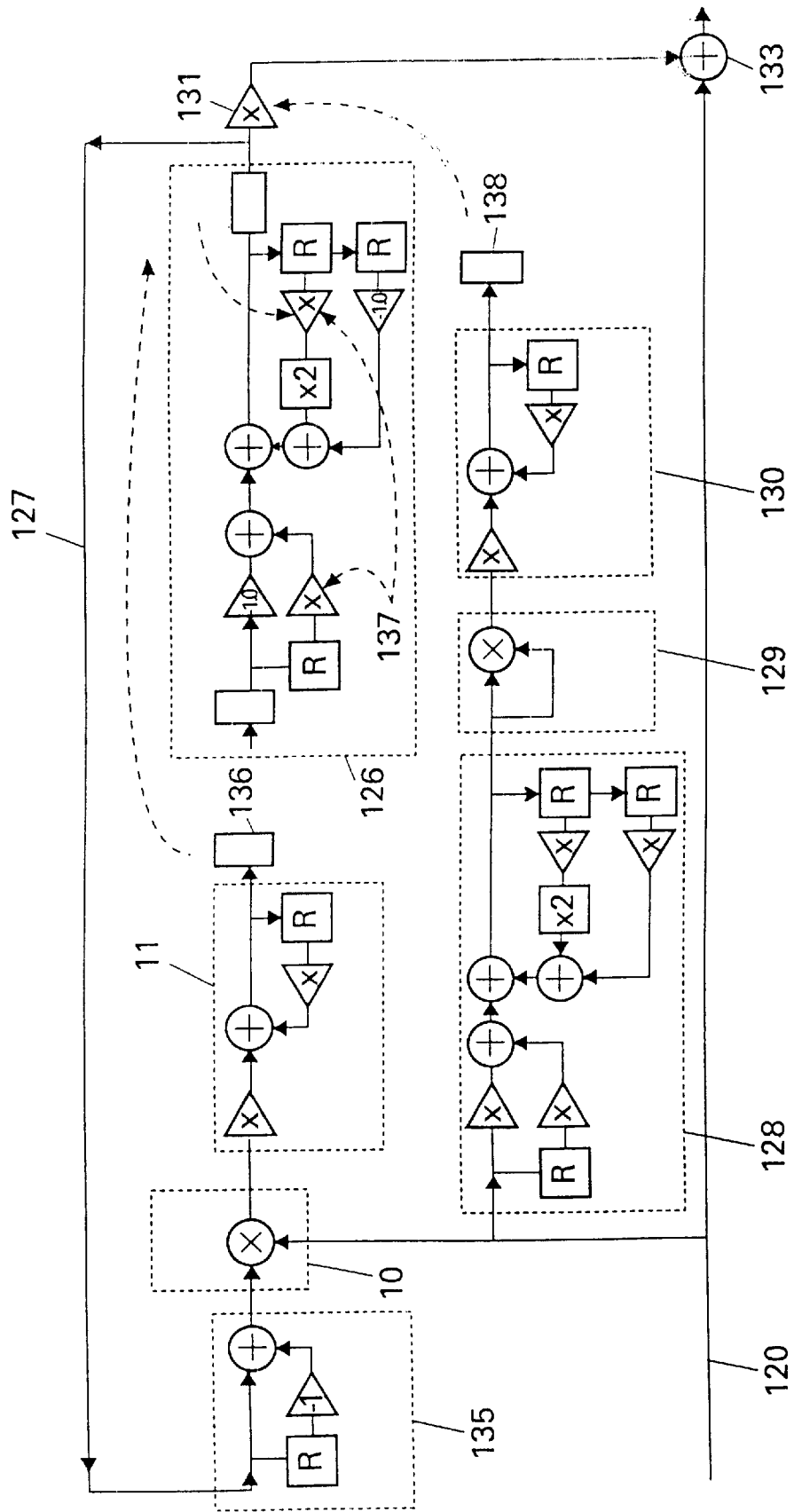
FIG. 6 shows a possible embodiment of the phase-locked loop according to FIG. 5.

FIG. 6 shows an implementation of the digital interference signal suppression unit 110 using digital filters, which are represented here diagrammatically by means of a register, multiplier and adder. The signal from the servo control 35 is passed into a phase detector 10 to which a further signal is applied from a 90° phase shifter 135. The input signal to the 90° phase shifter 135 is taken from a feedback loop 127 which will be explained later. The two input signals of the phase detector 10 are multiplied by one another. The result of this is that the output signal of the phase detector 10 is a sinusoidal signal without offset, that is to say without a direct-current component, when the input signals are mutually phase-shifted by precisely 90°. If the phase shift deviates from 90°, there is an increase in the direct-current component, which is a maximum for a phase shift of 0° or 180°. Consequently, the signal taken from the feedback loop 127 is shifted by 90° in the 90° phase shifter 135, in order to obtain an offset-free output signal when the signal at the input 120 and that of the feedback loop 127 are in phase. The output signal of the phase detector 10 passes to a low-pass filter 11, the coefficients of the multipliers represented being defined by a microprocessor unit (not represented here). After traversing this low-pass filter 11, which filters out the alternating-current component so that only the direct-current component is passed, the latter is extracted in 136 as the phase error. This phase error is fed to the discrete clock oscillator 126. Trigger pulses, phase errors 136 and reference values 137 are applied to this discrete clock oscillator 126. Present at the output of the discrete clock oscillator 126 is a digital sinusoidal signal whose level is determined in the amplifier 131 by the amplification signal 138, which is taken from the amplitude detector 123, which comprises the bandpass filter 128, the gain detector 129 and the low-pass filter 130. In this case, the bandpass filter 128 serves to pass only that frequency band in which the interfering components are situated. The output signal of the bandpass filter 128 is multiplied by itself in the gain detector 129, in order to obtain an absolute value whose direct-current component is obtained by means of the low-pass filter 130. A microprocessor can determine suitable coefficients for the amplifier 131 from the output signal of the low-pass filter 130, for example. Upstream of the amplifier 131, the generated sinusoidal signal of the discrete clock oscillator 126 is fed back to the 90° phase shifter 135 in order to generate the 90° phase-shifted signal which is used in the phase detector 10. The inverse interference signal thus generated is then added in the adder 133 to the servo signals, the result being to extinguish the interference signal. Consequently, only the pure control signals of the servo-control 35 pass to the actuator. It is particularly advantageous in the solution, which uses digital filters, that the coefficients of the digital filters can be prescribed from outside, resulting in such a circuit being extraordinarily flexible.

Using the exemplary embodiments explained above, it is possible to specify a phase-locked loop which is capable, without the use of an analog voltage-controlled oscillator and with recourse to an adaptive digital filter of second order, to react adaptively to a change in frequency of the input signal without the risk of unlocking or limiting the control precision by prescribing maximum hold ranges. Particularly advantageous applications arise for the digital phase-locked loop in the case of a targeted electronic compensation of resonant oscillations owing to mechanically movable components in optical scanning systems. Owing to the possibility of adaptive setting of the centre frequency as a function of the characteristic of the input signal, a phase-locked loop of such configuration has a relatively high control precision. Owing to the fact that the filter coefficients can be set in software terms in the event of a given digital filter structure, the phase-locked loop is highly flexible, as a result of which it is possible to provide cost-effective single-chip configurations which can be used in a multivalent fashion.

What is claimed is:

1. A reproducing or recording device for reproducing, or recording on, an optical recording medium, including a scanner which scans the optical recording medium and having an output connected to a tracking synchronization circuit, characterized in that the tracking synchronization circuit includes a variable centre-frequency oscillator.

2. Device according to claim 1, characterized in that the tracking synchronization circuit is a digital tracking synchronization circuit including a digital variable centre-frequency oscillator.

3. The device set forth in claim 2, characterized in that the tracking synchronization circuit contains a second order digital filter.

4. The device set forth in claim 1, characterized in that the tracking synchronization circuit contains at least one multiplier with variable multiplication factor.

5. Device according to claim 1, characterized in that a low-pass filter is arranged between the output of the digital phase detector and the input of the evaluation circuit, and the phase-locked loop formed is used in the servo-control for track and/or focus tracking of an optical scanning device of optical recording media in order to remove disturbing mechanical resonant frequencies.

6. A reproducing or recording device, for reproducing or recording on an optical recording medium, including a scanner which scans the optical recording medium, said scanner having an output connected to a tracking synchronization circuit, and said tracking synchronization circuit comprising:

an evaluation circuit having an input coupled to receive a phase difference signal (PS) and having an output providing at least one variable multiplication factor;

a variable frequency generator;

a multiplier included in said variable frequency generator and wherein said at least one variable multiplication factor is applied to said multiplier.

7. Reproducing or recording device, having a circuit arrangement for a digital phase-locked loop, containing a phase detector for comparing a reference signal with a tracking signal and for supplying an output value of the phase shift between the reference and tracking signals, and having a controller, which is connected to the output of the phase detector and leads to the input of a tracking oscillator, characterized in that the tracking oscillator is designed as a digital filter of second order with at least one, variable, programmable filter coefficient, the centre frequency being adapted by prescribing at least one updated filter coefficient, in the event of variation in the frequency of the reference signal beyond the instantaneous hold range of the filter.

8. Device according to claim 7, characterized in that the controller is an evaluation circuit for prescribing at least one adaptive filter coefficient, it being the case that given a prescribable small output value of the phase shift the frequency of the digital filter of second order is changed in corresponding small steps, and given a change in frequency for the reference signal new, updated filter coefficients of larger step width can be output, by detecting the overshooting of a prescribable larger output value of the phase shift, for the purpose of setting the adapted centre frequency.

9. Device according to claim 7, characterized in that the digital filter of second order has two complex poles in the unit circle, it being possible to determine the initialization filter coefficients C1 and C2 according to the following relationship:

$$C1 = C2 = \cos(2\pi F/Sf), \text{ where}$$

F=desired output frequency of the oscillator, and
Sf=sampling frequency of the digital filter.

10. Device according to claim 9, characterized in that the digital filter has a trigger module and a digital oscillator module, the trigger module serving to trigger the digital oscillator, and the digital oscillator having in the feedback branch a filter-coefficient multiplier whose coefficient can be varied as a function of the input frequency of the phase-locked loop.

11. Device according to claim 7, characterized in that a low-pass filter is arranged between the output of the digital phase detector and the input of the evaluation circuit, and the phase-locked loop formed is used in the servo-control for track and/or focus tracking of an optical scanning device of optical recording medium in order to remove disturbing mechanical resonant frequencies.

12. Device according to claim 7, characterized by a circuit for suppressing a howling noise of a moving servo-controlled scanning system, the circuit having an interference signal suppression unit which detects the interference signal causing the howling from the servo-control signal generates an inverse interference signal having the same amplitude and the opposite phase to the interference signal, and adds this inverse interference signal to the servo-control signal.

13. A reproducing or recording device, for reproducing or recording on an optical recording medium, including a scanner which scans the optical recording medium, said scanner having an output connected to a tracking synchronization circuit, said tracking synchronization circuit comprising:

a phase locked loop including a variable centre-frequency generator, having an input coupled to receive a servo-control signal, and having an output;

interference signal suppression circuits for suppressing a howling noise of a moving, servo-controlled scanning system including;

a detector coupled to receive said servo-control signal, to detect an interference signal causing the howling noise;

an amplifier controlled by said detector for conditioning signal provided by said output of the phase locked loop to exhibit an inverse interference signal having an equal amplitude and opposite phase to said interference signal; and combining circuitry having a first input coupled to an output of said amplifier and a second input coupled to receive said servo-control signal, and having an output providing a compensated servo control signal.

14. A method for suppressing a howling noise exhibited by an optical, servo-controlled scanning system of an optical disc player, said method comprising:

a) detecting an interference signal causing the howling in the servo-control signal, b) generating an inverse interference signal having an equal amplitude and opposite phase to the interference signal, and c) combining said inverse interference signals with the servo-control signal.

15. The method set forth in claim 14, wherein the step of detecting an interference signal comprises:

filtering a servo control signal to pass a predetermined band of frequencies thereof; and determining at least the amplitude of filtered said servo control signal.

16. The method set forth in claim 14, wherein;

said servo control signal is provided in digital form; and
said method is performed by digital circuitry.

* * * * *